United States Patent [19]

Vasudev

[11] Patent Number: 4,965,872
[45] Date of Patent: Oct. 23, 1990

[54] MOS-ENHANCED, SELF-ALIGNED LATERAL BIPOLAR TRANSISTOR MADE OF A SEMICONDUCTOR ON AN INSULATOR

[76] Inventor: Prahalad K. Vasudev, 290 Autumnwood St., Thousand Oaks, Calif. 91360

[21] Appl. No.: 249,038

[22] Filed: Sep. 26, 1988

[51] Int. Cl.⁵ .................... H01L 27/12; H01L 29/73; H01L 29/78
[52] U.S. Cl. .................... 357/35; 357/23.7; 357/43
[58] Field of Search ............ 357/35, 43, 23.7

[56] References Cited

U.S. PATENT DOCUMENTS

| | | | |
|---|---|---|---|
| 4,050,965 | 9/1977 | Ipri et al. | 357/35 |
| 4,109,272 | 8/1978 | Herbst et al. | 357/35 |
| 4,435,225 | 3/1984 | Berry et al. | 357/50 |
| 4,509,990 | 4/1985 | Vasudev | 357/4 |

FOREIGN PATENT DOCUMENTS

| | | | |
|---|---|---|---|
| 63915 | 11/1982 | European Pat. Off. | 357/23.7 |
| 93086 | 11/1983 | European Pat. Off. | 357/35 |

OTHER PUBLICATIONS

Colinge, IEEE Trans. on Electron Devices, vol. ED34, No. 4, Apr., 1987, pp. 845–849.
Vasudev, P.K. (1986) "Silicon-On-Sapphire Hereroepitaxy", *Epitaxial Silicon Technology*, Chapter 4, Academic Press, Inc.
*IEEE Circuits and Devices Magazine*, Jul. 1987, vol. 3, No. 4.
Scott et al., "CMOS Technology", *VLSI Handbook*, Chapter 10, Academic Press (1985).

*Primary Examiner*—William D. Larkins
*Attorney, Agent, or Firm*—Paul M. Coble; Wanda K. Denson-Low

[57] ABSTRACT

A self-aligned, lateral bipolar transistor is disclosed having at least one insulated metal gate for control of the base. The device has a Semiconductor-On-Insulator structure that reduces parasitic capacitances. Proper gate control provides a high and controllable gain of the device and also turns off the parasitic transistors. The device achieves variable, high gains as well as high frequencies due to the use of the gate. It requires no masking or doping manufacturing steps in addition to those used in making standard CMOS circuits, and is CMOS compatible. In a preferred embodiment, a second insulated metal back gate is used to further enhance the operation of the device.

12 Claims, 5 Drawing Sheets

MOS-ENHANCED, SELF-ALIGNED LATERAL BIPOLAR TRANSISTOR MADE OF A SEMICONDUCTOR ON AN INSULATOR

BACKGROUND OF THE INVENTION

1. Field of the Invention

The present invention relates to a lateral, bipolar transistor of the type formed in a semiconductor on an insulator. More particularly, this invention relates to a high speed, high gain bipolar transistor which may be manufactured without any additional masking or doping steps to those used in making standard CMOS devices, and is compatible with standard CMOS digital circuitry.

2. Description of the Related Art

Bipolar transistors and Metal-Oxide-Semiconductor (MOS) devices have historically been viewed as being separate and distinct types of devices, each having its own advantages and disadvantages.

A major advantage of bipolar devices is their ability to handle higher speeds at a higher power level than standard MOS devices. However, conventional bipolar devices typically have a fixed, low gain when compared to the idealized devices, which may be a disadvantage in many circuits since additional components may be needed to achieve a high gain. Also, many bipolars consume relatively large areas when compared to their MOS counterparts, making them unsuitable for certain applications. This tends to lower packing density and can also degrade the speed of the devices.

The slow speed of conventional bipolar transistors is in part caused by the existence of large parasitic capacitances between active regions in those bipolars that use a vertical geometry. The use of a Semiconductor-On-Insulator (SOI) structure tends to reduce these parasitic capacitances, and thereby increase the speed of such devices. Some of the advantages and characteristics of using an insulator, and particularly sapphire, are discussed in Vasudev (1986), "Silicon-OnSapphire Heteroepitaxy", *Epitaxial Silicon Technology*, Chapter 4, Academic Press, Inc.

A number of ways are known to reliably manufacture SOI Integrated Circuits (ICs), many of which are discussed in IEEE Circuits and Devices Magazine, July, 1987, Vol. 3, No. 4. Current techniques include Separation by Implanted Oxygen (SIMOX), scaled dielectric isolation, wafer bonding, Double Solid Phase Epitaxy (DSPE), Zone-Melting Recrystallization (ZMR), and the solid state epitaxy and regrowth (SPEAR) process discussed in U.S. Pat. No. 4,509,990 to Vasudev and assigned to Hughes Aircraft Company, the assignee of the present invention. For a general discussion of techniques for constructing MOS SOI circuits, see Scott et al., "CMOS Technology", *VLSI Handbook*, Chapter 10, Academic Press (1985).

Bipolars are typically of either vertical or lateral design. A typical lateral bipolar transistor using bulk silicon is disclosed in U.S. Pat. No. 4,435,225 issued Mar. 6, 1984 to Robert L. Berry et al. This device is slow, due to the large capacitances in the emitter-base and collector-base junctions. It also has a low gain as a result of losses arising from the high parasitics associated with the use of a silicon substrate is used without an insulation layer. FIGS. 1a and 1b depict cross-sections of typical prior art vertical and lateral bipolar devices, respectively.

As expected from their architecture, vertical bipolars such as the planar device shown in FIG. 1a typically have lower diffusion efficiencies, and require more isolation than lateral devices to prevent the formation of parasitic transistors or leakage currents flowing between adjacent, active devices. Of course, other types of devices need such isolation, including standard Complementary Metal Oxide Semiconductor (CMOS) components. Parasitic transistors are particularly a problem in Very Large Scale Integrated Chips (VLSICs) because the components are closely packed. The isolation of circuit components requires additional manufacturing steps, and increases the cost of the chip.

An increase in the size of the emitter-base and collector-base junctions in bipolar devices also has a tendency to decrease the cutoff bandwidth or maximum frequency of the device, due to an increase in parasitic capacitances with increased junction size. As shown by comparing FIGS. 1a and 1b, lateral bipolars typically have smaller junctions than vertical bipolars, and thus higher cutoff bandwidths.

Referring now to FIG. 1a, the emitter-base junction 10a of a vertical bipolar transistor is formed at the junction of emitter 11a and base 12a. Junction 10a is smaller than the corresponding emitter-base junction 10b of the lateral bipolar transistor shown in FIG. 1b. Junction 10b is formed between emitter 11b and base 12b.

Similarly, collector-base junction 13a in FIG. 1a forms the junction between collector 14a and base 12a. It is smaller in size than its counterpart, collector-base junction 13b in FIG. 1b. Junction 13b is formed at the interface of collector 14b and base 12b. The entire lateral device depicted in FIG. 1b is formed on a insulating substrate 15b. Regardless of whether a vertical or lateral bipolar device is considered, it is desirable to restrict the size of the junctions to make the device suitable for higher frequency applications. SPEAR, DSPE and standard SOS processes.

Lateral and vertical bipolars also differ in that lateral bipolars typically have higher base resistances than their vertical counterparts, resulting in lower common emitter gains. It is desirable to reduce the base resistance in a lateral bipolar by proper design and control of surface potential in order to increase its gain.

To make use of the advantages of bipolar and MOS devices, both types of devices have been manufactured on the same integrated circuit chip using vertical bipolars. Such so-called BIMOS circuits are difficult and expensive to reliably manufacture because one must generally use both bipolar and MOS masking and doping steps during the manufacturing process. Besides the increased expense involved with each additional manufacturing step, the probability of manufacturing defects in an IC increases with the number of steps.

BIMOS chips have also been made using lateral bipolars and CMOS devices on a bulk silicon substrate. However, these circuits are not satisfactory due to the poor frequency response of lateral bipolars when formed on a silicon substrate without an insulation layer.

A voltage controlled lateral bipolar-MOS transistor fabricated on an insulated substrate, and having a gate separated from the top surface of the base by a oxide layer, is disclosed in an article by the present inventor, "Recent Advances in Solid-Phase Epitaxial Recrystalization of SOS with Applications to CMOS and Bipolar Devices," *IEEE Circuits and Devices Magazine*, Vol. 3, No. 4, July, 1987, pages 17–19. Graphs of the common emitter current gain as a function of collector current for this device are presented in FIG. 1c for SOS npn lateral bipolar-MOS transistors fabricated by the SPEAR, DSPE and standard SOS processes.

SUMMARY OF THE INVENTION

In view of the above problems associated with the related art, a purpose of the present invention is to provide a gate controlled high speed, variable and high gain bipolar transistor that requires no additional masking and doping manufacturing steps than those used in making standard CMOS circuitry.

Another purpose of the present invention is to take advantage of some of the desirable features of both lateral bipolar and MOS devices by combining them into a single integrated device with unique properties.

Yet another purpose is to manufacture an MOS-enhanced, gate controlled bipolar device that has very high current gain.

These and other purposes are accomplished by providing a self-aligned lateral, bipolar transistor, of either the npn or pnp type, having at least one insulated gate for control of the base doping profile and surface potential. The device uses a SOI structure to reduce the parasitic capacitances associated with silicon-on-silicon structures. Proper gate control also turns off the parasitic transistors that would normally result in leakage currents between adjacent, active devices and also allows a method of electrically controlling the gain of the bipolar transistor.

In a preferred embodiment, two independently-controlled insulated polysilicon or metal gates are used; this permits complete control of both the upper and lower surface potentials of the base. The gates reduce the resistance of the base by creating P+regions at the upper and lower surfaces of the base, in a npn bipolar for example, thereby increasing the current gain and speed.

The MOS-enhanced, lateral bipolar architecture enables the device to be manufactured with the same masking and doping steps used in making standard CMOS circuitry. The device is also compatible with CMOS devices. It achieves a variable gain by varying the voltage to at least one of the gates, which in turn varies the gain of the transistor as well as the resistance.

The device is capable of achieving very high common emitter gains, on the order of 1000 or greater. The base region has a long lifetime when a high quality, low defect material is used. In addition, the lateral SOI architecture results in a very high frequency response, due to the reduction of parasitic capacitances and the reduced size of the junction areas. Frequencies on the order of 10 gigahertz have been achieved when two insulated polysilicon gates were used, while frequencies of 100 gigahertz are theoretically predicted. The lateral SOI mesa type architecture also simplifies manufacturing, since it requires no special isolation processing from adjacent active devices.

These and other features and advantages of the present invention will be apparent to those skilled in the art from the following detailed description of a preferred embodiment, and the attached drawings.

DETAILED DESCRIPTION

Figure 1A:
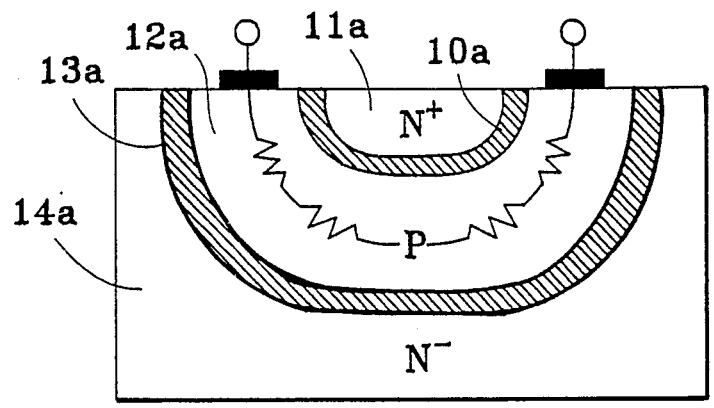
FIG. 1a is a cross-sectional view of a typical prior art planar vertical bipolar transistor.
Figure 1B:
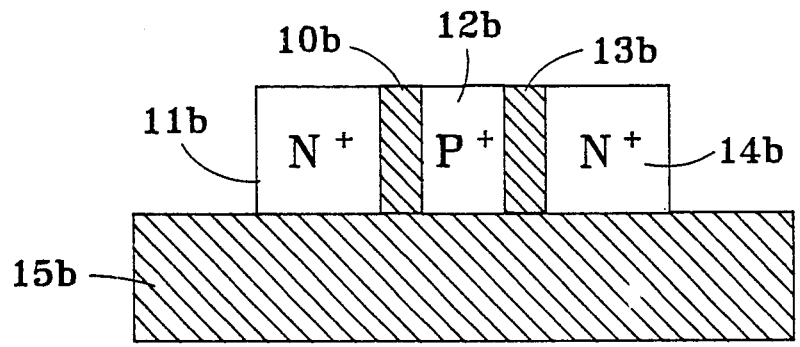
FIG. 1b is a cross-sectional view of a typical prior art lateral bipolar transistor.
Figure 1C:
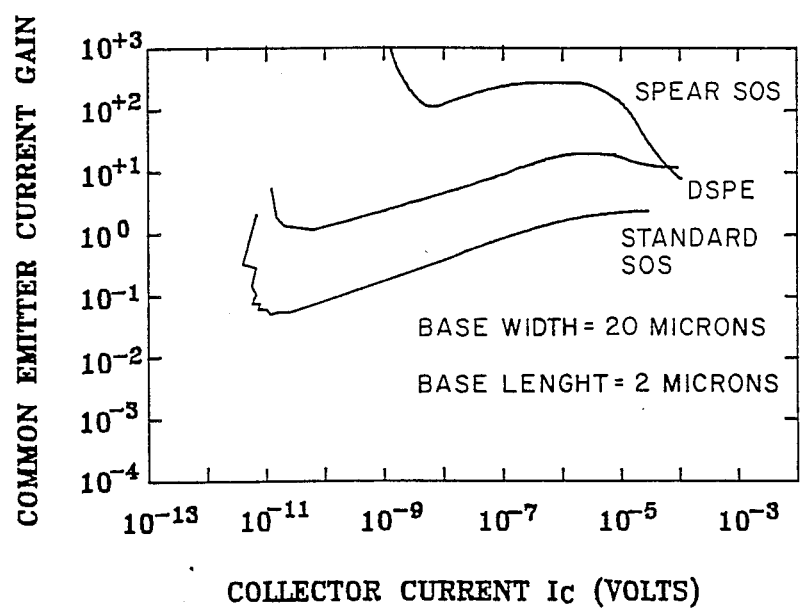
FIG. 1c is a graph of the collector current versus the common emitter current gain for SOS npn lateral bipolar transistors fabricated by various prior art processes.
Figure 2:
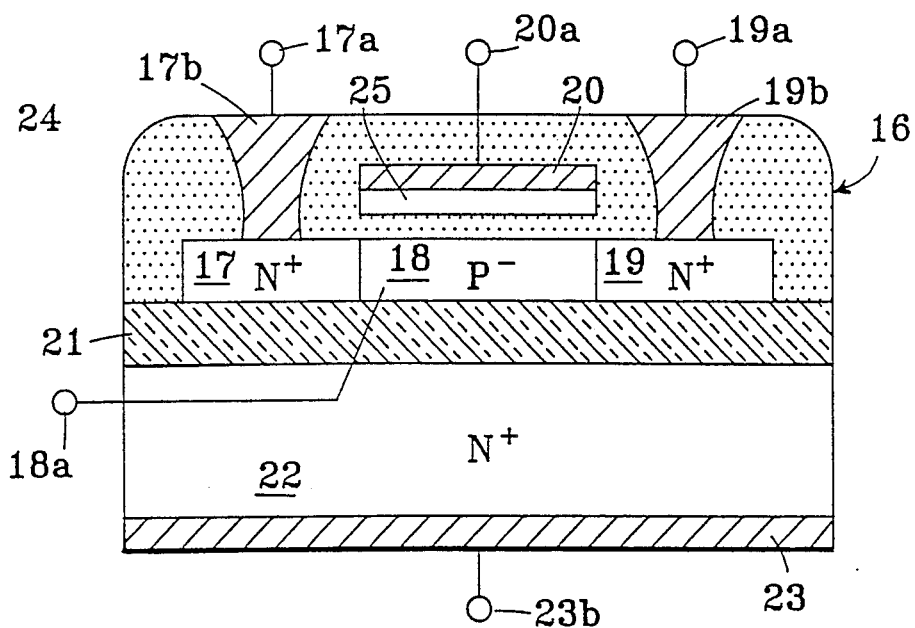
FIG. 2 is a cross-sectional view of a preferred embodiment of the present invention, employing two insulated silicon gates.

FIG. 2 depicts a cross-section of a preferred embodiment of the bipolar transistor according to the present invention, in which two insulated metal contacts 20 and 23 are used to form two insulated polysilicon MOS gates. The terms "insulated gate ", "MOS gate ", and "Metal-Oxide-Semiconductor gate" are used interchangeably herein. The gate is formed from a metal, metallic compound and/or doped polyconstalline semiconductor and is separated from the base by an insulator. Although FIG. 2 depicts npn bipolar, it should be understood that a pnp device would also be within the scope of the present invention.

In FIG. 2 the lateral bipolar transistor 16 is of the mesa type, and is formed on a substrate 22. Substrate 22 may be either a semiconductor material such as silicon, or it may be an insulator such as aluminum oxide, $Al_2O_3$. If it is made of silicon, it is doped with donors, on the order of $10^{17}$ donors/cm$^3$. The designation "N+" in FIG. 2a indicates such doping. If substrate 22 is made of an insulator, then it should be relatively thin and is an extension of insulation layer 21. If substrate 22 is made of a relatively thick insulator, the back gate including metal contact 23 may be inoperative for practical purposes and may be omitted. For the purposes of this discussion it is assumed that substrate 22 is made of a doped semiconductor.

An insulator 21 is formed as a layer on substrate 22 by any of a number of techniques that are well-known to those skilled in the art. For sapphire insulators, these techniques include flame fusion or Verneuil growth, Czochralski growth, and edge-defined film-fed growth. See P.K. Vasudev (1986), "Silicon-On-Sapphire Heteroepitaxy", *Epitaxial Silicon Technology*, Chapter 4, Academic Press.

Sapphire has been found to be a particularly suitable material for insulator 21, although other materials may be used such as silicon dioxide, aluminum oxide, or other metal oxides. The thickness of insulator 21 is preferably in the range of 500 to 7000 Angstroms. A primary purpose of insulator 21 is to reduce parasitic capacitances within transistor 16. Insulator 21 prevents any current from flowing across substrate 22, and between emitter 17 and base 18 except across the emitter-base junction. Similarly, insulator 21 prevents any current from flowing between base 18 and collector 19 except across the collector-base junction. The reduction of the parasitic capacitances also increases the speed of the device.

A semiconductor layer made of a single crystal film may be deposited on insulator 21 by a variety of methods, including vacuum evaporation, sputtering, molecular-beam epitaxy (MBE), and chemical vapor deposition (CVD). CVD is the most successful technique. The CVD growth process on a sapphire insulator consists of a high-temperature (1150° C.) hydrogen prefire of the sapphire for surface passivation and heat cleaning. This prefiring is followed by a decomposition of silane in hydrogen at a reduced temperature of 900–1000 C. The deposition rate varies from about 0.1 microns per minute to over 3 microns per minute. After growth, the wafer is cooled slowly at room temperature in a hydrogen atmosphere.

Emitter 17, base 18, and collector 19 are formed as doped semiconductor regions in the semiconductor layer. In the npn transistor depicted in FIG. 2, emitter 17 and collector 19 are heavily doped with donors on the order of $10^{20}$ donors/cm$^3$. Base 18 is lightly doped with carriers, such doping being on the order of $10^{16}$–$10^{17}$ carriers/cm$^3$.

The height of emitter 17, base 18, and collector 19 is typically in the range of 300 Angstrom to 2 microns, with 0.5 microns having been determined to be the preferred height for the embodiment depicted in FIG. 2. The width of base 18, which is equal to the length of gate 20, is preferably in the range of 0.1 to 1 micron. The lengths of emitter 17 and collector 19 are not critical dimensions, but are about 4 microns each.

Assuming that the base height is 0.5 microns, the base width is 1 micron, and the thickness of insulator 21 is 5000 angstroms, then the preferred operating parameters are:

Vce=0–3 volts
Ice=10 milliamps
Ib=0–10 microamps where
Vce is the collector-to-emitter voltage;
Ice is the collector-to-emitter current; and
Ib is the base current.

Of course, electrical connections are needed to control the operation of the transistor. Lead wire 17a and contact 17b comprise the electrical connection for emitter 17, lead wire 18a and a contact (not shown) comprise the electrical connection for base 18, and lead wire 19a and contact 19b comprise the electrical connection for collector 19. Lead wire 20a and contact 20 also control the base as described herein. Aluminum is a suitable material for these electrical connections, although others may be used. The holes for lead wires 17a and 19a are about 0.5 to 2 microns in diameter, depending upon the size of the device.

Another insulator 24 is formed as an overlay on transistor 16 to protect the device. Insulator 24 may be made from a number of different materials that are well-known to those skilled in the art, such as silicon dioxide.

Contact 23 together with substrate 22 form the back gate of transistor 16. Contact 23 preferably covers the entire back surface of substrate 22 so that it forms the metal contact for the back gate of transistor 16 as well as for adjacent active MOS-enhanced transistors.

In the case of the upper gate, a portion of insulator 24- approximately 100 to 300 Angstroms thick- lies between the polysilicon layer 25 and base 18. The upper gate is comprised of contact 20, polysilicon layer 25, and insulator 24. Suitable materials for use in contact 23 are metal silicides, such as titanium silicide and tantalum silicide. Contact 23 may be made from aluminum.

Although the preferred embodiment disclosed herein uses two insulated metal or MOS gates, the use of one MOS gate in a bipolar transistor is within the scope of the invention. For example, the back gate may be omitted and the advantages of the present invention still be achieved.

One of the problems with manufacturing prior art MOS field effect transistors is the proper alignment of the gate over the channel region, so that the length of the gate is the same as the width of the channel, and is exactly above the channel. Correct gate alignment is critical for optimal functioning of the device. The gate is typically created after the channel, which makes gate alignment difficult to achieve.

MOS devices are known which are "self-aligning". In such devices, the channel region is created after the gate is deposited, and indeed the gate acts as a mask during the creation of the source and drain regions. Using this technique, the gate length becomes the channel width, and the problem of misalignment is avoided.

Transistor 16 is self-aligning since polysilicon layer 25 is created before the doping step that creates emitter 17 and collector 19. Layer 25 serves as the mask during the creation of emitter 17 and collector 19. In this way, the upper gate is always properly aligned over base 18, since the dimensions of the upper gate are used to define the dimensions of base 18.

The fabrication of the embodiment depicted in FIG. 2 is more specifically described as follows. Oxygen ions are ion implanted into a silicon wafer at an energy of 200 keV and a concentration of $1.5$–$1.8 \times 10^{18}$ ions/cm$^2$. An oxide cap is then placed on the implanted wafer, and the wafer is annealed at 1350° C. for about one hour. The oxide cap is removed after annealing. The result of the process thus far is a Silicon-On-Insulator structure having bulk silicon as the substrate, a 6000 Angstrom oxide layer 21 on the substrate, and a 3000 Angstrom silicon film on top of the oxide layer.

A preferred method of creating the SOI structure is the SPEAR process referenced above, because it yields a higher quality material. In the SPEAR process, a thin silicon layer is epitaxially deposited, by CVD as described above, on a surface of an insulator so that it has a given defect density at the silicon/insulator interface. The defect density generally decreases toward the exposed silicon surface. Next, a low energy ion implantation of less than about 90 keV is made into the silicon layer to convert a portion of the silicon layer into a buried amorphous silicon layer. Silicon ions may be used for the implantation. The composite substrate is then twice annealed. The first annealing is done at 500–900° C. and causes the amorphous layer to regrow from an amorphous/crystal interface. The second annealing is done at about 910° C., and reduces the crystalline defect density throughout the silicon. This is essential in order to obtain the high lifetimes needed in the base to achieve good bipolar action.

After the SOI structure is created, the silicon film is etched to create the desired mesa or island regions using a plasma etch in carbon tetraflouride. A photoresist material is used as a mask. The etching ceases when the etching material reaches the oxide layer.

The base region is created by masking off the islands. Boron ions are implanted to create a p-type base for an npn bipolar transistor. Arsenic ions are implanted to create a n-type base for a pnp transistor. A thin oxide layer of 120 Angstrom in thickness is then grown over all of the islands. It is heated in an oxygen furnace at 850° C. for 9 minutes.

To form the upper gate, a layer of polysilicon is deposited by CVD over the entire wafer until it reaches a thickness of 4000 Angstrom. The polysilicon is heavily doped with donors (N+) during deposition. A photoresist material is used as a mask to define the boundaries of the gate region. The remainder of the polysilicon layer outside the gate regions is etched away using a plasma etching process as described above.

The emitter and collector regions are then formed. The remaining polysilicon acts as a mask to cover those regions, which will become the bases of the bipolar devices. The polysilicon areas also define the boundaries of the upper gates, so that the boundaries of the upper gates coincide with the boundaries of bases.

To form a npn transistor, all regions that are to be p-type are covered. Arsenic ions are implanted into the two sides of each island not covered by the polysilicon to create the n-type emitter and collector regions. To form a pnp transistor, all regions that are to be n-type are covered, and boron ions are implanted into the two sides of each island not covered by the polysilicon to create the p-type emitter and collector regions. The concentration of the boron ions should be 2-3 orders of magnitude greater than the concentration of the arsenic ions used to create the n-type regions. In this way, both npn and pnp lateral bipolars may be created on the same IC along with CMOS devices without any additional steps to those used in creating the CMOS devices.

The contacts for the emitter, base, and collector regions are then created. An overlaid oxide layer of 5000 Angstroms is deposited by CVD over the entire device. Holes for the contacts are created in the oxide layer by using a masking and etching process as described above. A metal is then evaporated over the entire device. The metal drops into the holes until it makes contact with the silicon in the emitter, base, and collector regions. The metal that is not used for the contacts is etched with a transene etch.

The metal contact for the back gate is created by evaporating or sputtering aluminum using a heated filament onto the entire back surface of the substrate. The metal contact under any given device thus partially acts as the back gate for adjacent active devices, and helps ensure that the back gate voltage is the same for adjacent active devices. It is also within the scope of this invention to create the back gate so that it only affects a single device by etching away any porion of the aluminum that may affect an adjacent device.

Control of the voltages applied to the upper and back gates causes P+regions to form in base 18 near the interfaces of base 18 and both insulating layers. These regions have been found to produce higher gains than in a typical lateral bipolar. Without the gates and using a bulk silicon material, the common emitter gain of the transistor would be fixed at about 10; the gain with the gates, and using a high quality material may be as high as 1000 at normal operating voltages and is much higher at low base voltages. A positive voltage applied to either the upper gate or the back gate increases the gain exponentially up to a maximum that can be as high as $10^5$; the maximum gain is reached when current crowding causes saturation. A negative potential applied to either gate tends to decrease the gain slightly. The gain of the device can be varied by independently controlling the voltages applied to the two gates. The voltage applied to the upper gate is typically in the range of about 0 to 5 volts, whereas the voltage applied to the back gate is typically in the range of about 0 to 20 volts. These numbers can be varied by changing the dimensions of the insulator regions.

To achieve the high current gains mentioned above, it may be necessary to manufacture the device using a high quality material that has a low density of crystalline defects. Preferred techniques for manufacturing such a material are taught in U.S. Pat. No. 4,509,950 referenced above, and in the chapter by Vasudev, P.K. (1986), entitled "Silicon-On-Sapphire Heteroepitaxy" referenced above. The DSPE method may also yield acceptable results for some applications, though not as good as those achieved when the SPEAR process disclosed in U.S. Pat. No. 4,509,990 is used.

The use of a high quality material also has the advantage of greatly increasing the life of the base, and thus of the entire device.

The use of one or more MOS gates also reduces the resistance in base 18 by creating the P+regions discussed above. The application of negative voltage to either or both of the gates has been found to reduce the base resistance by several orders of magnitude. This reduction in the base resistance has the effect of greatly increasing the cutoff frequency of transistor 16 because it reduces the emitter-base and collector-base capacitance. The reduction in these capacitances may reduce the device's transfer time by as much as sixty percent. The gates also reduce the surface recombination at the two surfaces of base 18, which helps achieve the higher cutoff frequency. The application of positive voltages to either or both of the gates only slightly affects the base resistance.

Figure 3A:
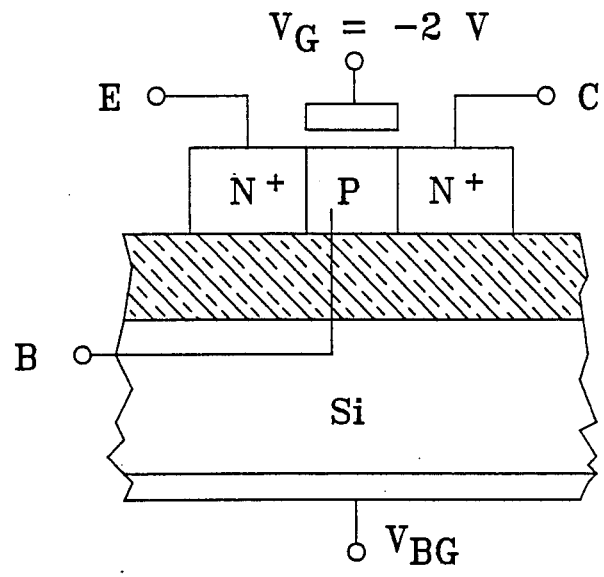
FIG. 3a is a cross-sectional view of the structure of the present invention that was used to obtain the test data for the graphs in FIGS. 3b through 3d.
Figure 3B:
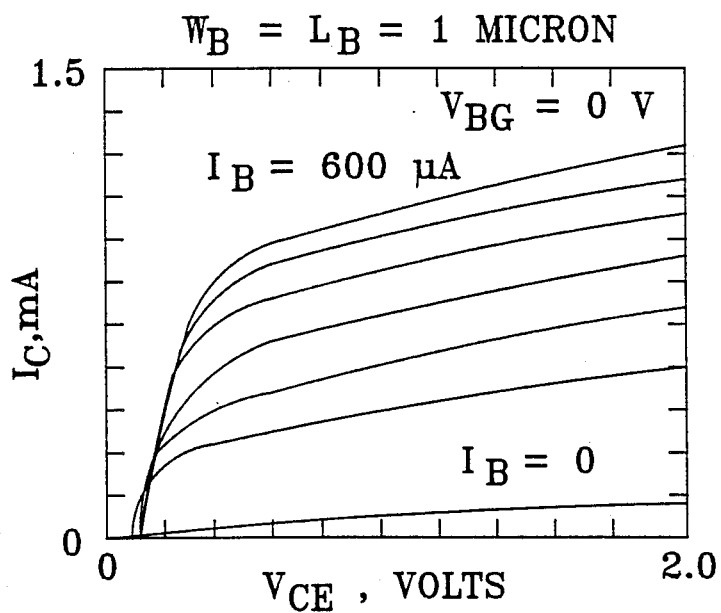
FIG. 3b is a set of curves showing the collector current Ic as a function of the collector-emitter voltage Vce for various base current Ib values, and with a zero back gate voltage Vbg.
Figure 3C:
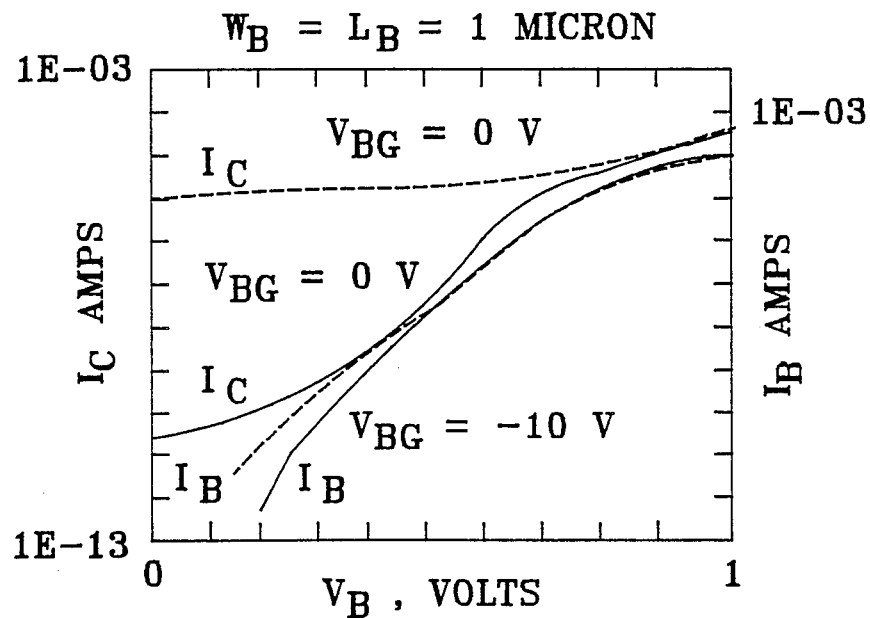
FIG. 3c is a combined graph of the collector current versus the collector-emitter voltage when the back gate voltage is both zero volts and −10 volts, and of the base current versus the collector-emitter voltage when the back gate voltage is both zero volts and −10 volts.
Figure 3D:
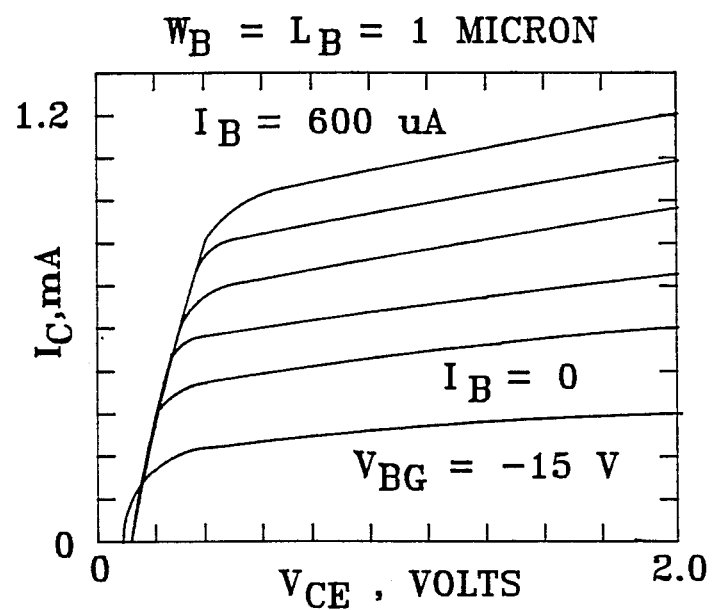
FIG. 3d is a set of curves showing the collector current as a function of the collector-emitter voltage for various base current values, and with a back gate voltage of −15 volts.

Test data was obtained for the embodiment of the invention depicted in FIG. 3a. This test data is illustrated in FIGS. 3b through 3d. In FIGS. 3a through 3d:

Vg is −2 volts, the voltage applied to the upper gate;
Vbg is the voltage applied to the back gate:
Vb is the base voltage;
Vce is the collector-emitter voltage;
Ib is the base current;
Ic is the collector current;
Wb is the width of the base;
Lb is the length of the base.

FIG. 3b is a graph of the collector current versus the collector-emitter voltage for several values of base current. In FIG. 3b, the back gate voltage is held at zero; the device effectively has only a single insulated metal gate. In FIG. 3d the back gate voltage is −15 volts.

FIG. 3c is a combined graph of collector current versus base voltage and of base current versus base voltage. The dotted curves correspond to a back gate voltage of zero; the solid curves correspond to a back gate voltage of −10 volts. In FIG. 3c, the current gain for a base voltage of 0.3 volts is on the order of 10,000 when the back gate voltage is zero. The gain decreases as the base voltage approaches 1 volt. By comparison, the current gain is about 10 when the base voltage is 0.3 volts and the back gate voltage is −10 volts.

While a particular embodiment of the invention has been shown and described, numerous modifications and alternate embodiments will occur to those skilled in the art. Accordingly, it is intended that the invention be limited only by the following claims.

What is claimed is:

1. An improved, lateral bipolar transistor, comprising:
   a first insulation layer;
   a first semiconductor layer adjacent to said first insulation layer, said first semiconductor layer having emitter, base, and collector regions formed therein in a lateral bipolar transistor configuration;
   a first gate on said first insulation layer aligned with said base region and separated from said base region by said first insulation layer, said first gate controlling the base resistance in response to voltage signals applied to said first gate;
   means for establishing electrical conditions to said emitter, base, and collector regions and an active electrical connection to said first gate;
   a second insulation layer on the opposite side of said first semiconductor layer from said first insulation layer;
   a second gate on said second insulation layer separated from the base region by said second insulation layer, said second gate controlling the base resistance independent of said first gate in response to voltage signals applied to said second gate, the interface between said second insulation layer and aid second gate being substantially planar; and
   means for establishing an active electrical connection to said second gate.

2. The bipolar transistor of claim 1, further comprising:
   a second semiconductor layer between said first gate and said first insulation layer.

3. The bipolar transistor of claim 1, wherein said first semiconductor layer is made of a material having a low density of crystalline defects.

4. The bipolar transistor of claim 1, wherein said first gate is self-aligned with respect to said base region.

5. The bipolar transistor of claim 1, wherein the width of said base region is about 0.5–1.0 micron.

6. The bipolar transistor of claim 1, wherein the height of said first semiconductor layer is about 0.5 microns.

7. The bipolar transistor of claim 1, further comprising:
   an overlaid insulative layer surrounding said first semiconductor layer and protecting said transistor.

8. A lateral bipolar transistor having a variable common emitter current gain, comprising:
   a first insulation layer;
   a first semiconductor layer adjacent to said first insulation layer, aid first semiconductor layer having emitter, base, and collector regions formed therein in a lateral bipolar transistor configuration;
   a first gate on said first insulation layer aligned with said base region an separated from said base region by said first insulation layer, aid first gate controlling the common emitter current gain of said transistor in response to voltage signals applied to said first gate;
   means for establishing electrical connections to said emitter, base, and collector regions and an active electrical connection to said first gate;
   a second insulation layer on the opposite side of said first semiconductor layer from said first insulation layer;
   a second gate on said second insulation layer for controlling the common emitter current gain of said transistor independent of said first gate in response to voltage signals applied to said second gate, the interface between said second insulation layer and said second gate being substantially planar; and
   means for establishing an active electrical connection to said second gate.

9. The lateral bipolar transistor of claim 8, further comprising:
   a second semiconductor layer between said first gate and said first insulation layer.

10. The bipolar transistor of claim 8, said second gate comprising a doped semiconductor layer in contact with said second insulation layer, and a conductive contact layer on said doped semiconductor layer.

11. The bipolar transistor of claim 10, wherein the interface between said doped semiconductor layer and said contact layer is substantially planar.

12. An improved, lateral bipolar transistor, comprising:
    a first insulation layer;
    a first semiconductor layer adjacent to said first insulation layer, said first semiconductor layer having emitter, base, and collector regions formed therein in a lateral bipolar transistor configuration;
    a first gate on said first insulation layer aligned with said base region and separated from said base region by said first insulation layer, said first gate controlling the base resistance in response to voltage signals applied to said first gate;
    means for establishing electrical connections to said emitter, base, and collector regions and an active electrical connection to said first gate;
    a second insulation layer on the opposite side of said first semiconductor layer from said first insulation layer;
    a second gate on said second insulation layer separated from the bas region by said second insulation layer, said second gate comprising a doped semiconductor layer in contact with said second insulation layer and a conductive contact layer on said doped semiconductor layer, the interface between said doped semiconductor layer and said contact layer being substantially planar, said second gate controlling the base resistance independent of said first gate in response to voltage signals applied to said second gate; and
    means for establishing an active electrical connection to said second gate.

* * * * *